(12) United States Patent
Smith

(10) Patent No.: US 6,947,333 B2
(45) Date of Patent: Sep. 20, 2005

(54) MEMORY DEVICE

(75) Inventor: Kenneth K. Smith, Boise, ID (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 131 days.

(21) Appl. No.: 10/699,023

(22) Filed: Oct. 30, 2003

(65) Prior Publication Data

US 2005/0094438 A1 May 5, 2005

(51) Int. Cl.$^7$ .............................................. G11C 11/00
(52) U.S. Cl. .................. 365/189.01; 365/209; 365/158; 365/97; 365/171; 365/173
(58) Field of Search ............................ 365/189.01, 209, 365/158, 97, 171, 173

(56) References Cited

U.S. PATENT DOCUMENTS

| | | | | |
|---|---|---|---|---|
| 5,329,485 A | * | 7/1994 | Isono et al. .................. 365/145 |
| 5,640,343 A | * | 6/1997 | Gallagher et al. .......... 365/171 |
| 5,793,697 A | * | 8/1998 | Scheuerlein ........... 365/230.07 |
| 5,838,608 A | | 11/1998 | Zhu et al. |
| 5,940,319 A | | 8/1999 | Durlam et al. |
| 5,946,228 A | | 8/1999 | Abraham et al. |
| 5,978,257 A | * | 11/1999 | Zhu et al. .................... 365/173 |
| 6,097,625 A | | 8/2000 | Scheuerlein |
| 6,104,633 A | | 8/2000 | Abraham et al. |
| 6,130,835 A | * | 10/2000 | Scheuerlein ................ 365/171 |
| 6,191,972 B1 | | 2/2001 | Miura et al. |
| 6,259,644 B1 | | 7/2001 | Tran et al. |
| 6,269,018 B1 | | 7/2001 | Monsma et al. |
| 6,285,581 B1 | | 9/2001 | Tehrani et al. |
| 6,356,477 B1 | | 3/2002 | Tran |
| 6,421,271 B1 | | 7/2002 | Gogl et al. |
| 6,473,337 B1 | * | 10/2002 | Tran et al. ................... 365/173 |
| 6,483,734 B1 | * | 11/2002 | Sharma et al. ................ 365/97 |
| 6,636,436 B2 | * | 10/2003 | Perner ......................... 365/158 |
| 6,807,094 B2 | * | 10/2004 | Saito et al. .................. 365/173 |
| 2004/0001348 A1 | * | 1/2004 | Vyvoda et al. ................ 365/51 |
| 2005/0073881 A1 | * | 4/2005 | Tran et al. ................... 365/158 |

* cited by examiner

Primary Examiner—Viet Q. Nguyen

(57) ABSTRACT

A memory device, which includes a matrix of memory cells, and an arrangement of write lines electrically isolated from the memory cells. The write lines may be configured to write data to the memory cells, each write line of the arrangement being electrically coupled to a reverse current limiting device.

31 Claims, 7 Drawing Sheets

US 6,947,333 B2

MEMORY DEVICE

BACKGROUND

Magnetoresistive random access memory stores bits of data using magnetic state instead of electric charge. Unlike conventional semiconductor random access memory, which typically is volatile, MRAM is nonvolatile, meaning it does not rely on a constant source of power to retain stored information. At the same time, MRAM offers fast read and write speeds and favorable density attributes. Therefore, MRAM is a promising memory technology for a wide range of applications.

MRAM typically includes a portion of a fabricated semiconductor wafer upon which circuit elements (transistors, diodes, etc.) are defined. As with other integrated circuits, the price of MRAM is inversely related to the number of circuit elements defined per unit area of semiconductor. Cost may also be lessened with designs that maximize the utility of each circuit element that is defined on the semiconductor.

SUMMARY

A memory device is provided, which includes a matrix of memory cells, and an arrangement of write lines electrically isolated from the memory cells. The write lines may be configured to write data to the memory cells, each write line of the arrangement being electrically coupled to a reverse current limiting device.

DETAILED DESCRIPTION

Figure 1:
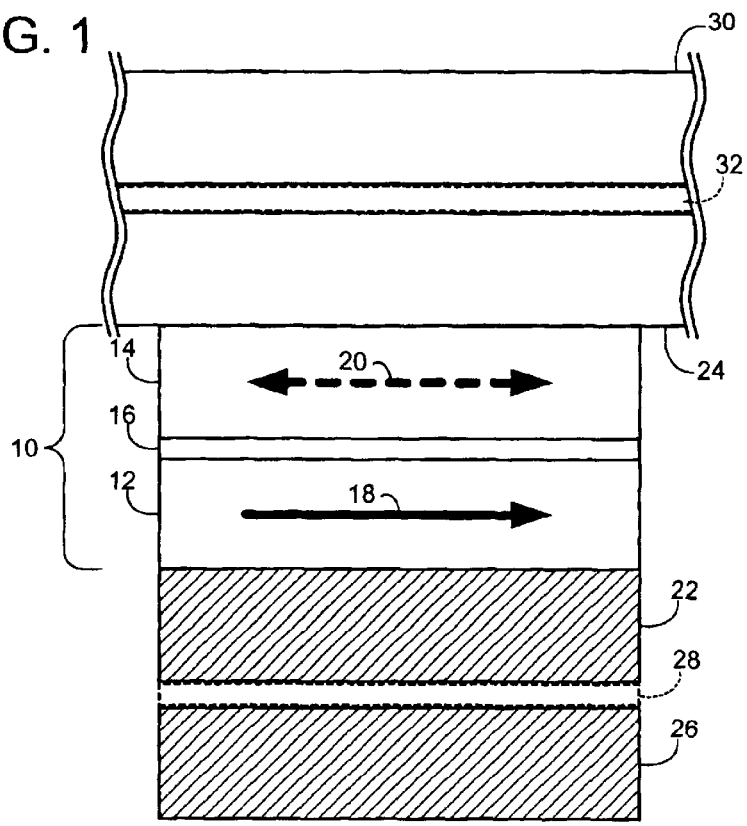
FIG. 1 is a schematic view of a memory cell and associated conductors for writing and reading data to and from the memory cell.

FIG. 1 schematically illustrates a memory cell 10, which includes a reference layer 12 and a storage layer 14 separated by an insulating layer 16. Reference layer 12 typically is characterized by a magnetic moment 18 that does not easily rotate. Storage layer 14, on the other hand, typically is characterized by a magnetic moment 20 that may be selectively toggled between an orientation aligned with the magnetic moment of the reference layer, and an orientation opposing the magnetic moment of the reference layer. The memory cell is said to be in a parallel state when the magnetic moment of the reference layer aligns with the magnetic moment of the storage layer, and an anti-parallel state when the magnetic moment of the reference layer opposes the magnetic moment of the storage layer.

Insulating layer 16 separates the reference layer from the storage layer. However, insulating layer 16 may be thin enough to allow electrons to tunnel through the insulating layer, thus creating a charge path through the memory cell. The resistance through the memory cell may be dependent on the state of the memory cell, with a memory cell in a parallel state typically exhibiting less resistance than a memory cell in an anti-parallel state. The relative level of resistance may be assigned a binary logic value. For example, a relatively high resistance associated with an anti-parallel state may be assigned a logic value 0, while a lower resistance associated with a parallel state may be assigned a logic value 1, or vice versa.

The logic value associated with a memory cell is effectively defined by the orientation of the magnetic moment of the storage layer of the memory cell. The memory cell may be configured so that the orientation of the magnetic moment of the storage layer selectively toggles in response to a controllable magnetic field. In particular, the memory cell may be configured so that the magnetic moment of the storage layer toggles in response to the collective magnetic effect of current simultaneously flowing through a column conductor 22 and a row conductor 24, which cross opposite sides of the memory cell substantially perpendicular to one another. In such arrangements, if current passes through only one of the column and row conductors, or through no conductor, the magnetic moment of the storage layer typically will not toggle. As described in more detail below, a column conductor write line 26 may be provided to perform write functions that would otherwise be performed by column conductor 22; and/or a row conductor write line 30 may be provided to perform write functions that would otherwise be performed by row conductor 24.

Column conductors and row conductors may be individually controlled to selectively conduct a current of a desired magnitude, or within a desired range of magnitudes. Furthermore, in some arrangements, the direction of the current may be controlled. For example, current through the row conductors, column conductors, or both row and column conductors, may be directed in a forward or reverse direction. In some embodiments, current along one axis, such as that directed through the column conductors, will travel only in a forward direction, and current along another axis, such as that directed through the row conductors, may be selectively directed in either forward or reverse directions, wherein one direction is used to effectuate a toggling to a logic value 0, and the other direction is used to effectuate a toggling to a logic value 1. When configured to selectively conduct current for toggling the state of the memory cell, column conductor 22 and row conductor 24 may be referred to as write lines.

Memory cell 10 may be selectively interrogated with a test current or voltage to determine the state of the memory cell. The resistance of the memory cell typically depends on the state of the memory cell (e.g. parallel or anti-parallel). Therefore, a logic value assigned to a particular state may be determined by measuring the resistance of the memory cell. The process of determining the state of a memory cell is commonly referred to as reading the memory cell. To read the cell, a known potential difference may be established across the cell to facilitate measurement of the resistance of the cell. Column conductor 22 and row conductor 24 may be configured to provide the potential difference, because column conductor 22 and row conductor 24 typically are electrically coupled to the memory cell. Charge may tunnel from one conductor to the other through the memory cell, and resistance may be measured across the memory cell using the conductors that are electrically coupled to the memory cell. On the other hand, column conductor 26 and row conductor 30 typically are electrically isolated from the memory cell, thus limiting the ability of charge to tunnel through the cell, from one conductor to the other. When configured to read the memory cell, column conductor 22 and row conductor 24 may be referred to as read lines. In some embodiments, column conductor 22 and/or row conductor 24 may be configured for reading and writing data to the memory cell, and in such embodiments, the conductor(s) may be referred to as read/write lines.

A column conductor write line 26 that is electrically isolated from the memory cell may be used to write data to the memory cell. As described with reference to column conductor 22 and row conductor 24, current may be selectively passed through column conductor write line 26, thus affecting the magnetic field at memory cell 10, and facilitating writing data to the memory cell. An insulating layer 28 may be used to insulate column conductor write line 26 from column conductor 22 and memory cell 10. When isolated write line 26 is provided, column conductor 22 may be configured to perform only read operations. Row conductor 24 may be used for read and write operations, or a row write line 30 may be included, thus allowing row conductor 24 to be used for only read operations. An insulating layer 32 may be provided to electrically isolate row write line 30 from row conductor 24 and memory cell 10. Separating read and write functions between different conductors may reduce the amount of semiconductor area used to produce a memory device.

As described above, a memory cell may be written to and read from using a number of different possible arrangements. In a two conductor arrangement, column conductor 22 and row conductor 24 may be configured as read/write lines, each responsible for reading and writing data to the memory cell. In a three conductor arrangement, a write line may be added, resulting in an arrangement with one write line, one read line, and one read/write line. In a four conductor arrangement, two write lines may be present for writing data, and two read lines may be present for reading data. Other configurations may be implemented, and the above are provided as nonlimiting examples. Dividing read and write functionality between two conductors may allow the size of switches, such as transistors, used to control the read lines to be reduced, thus limiting the amount of semiconductor area used to fabricate the switches.

Memory cell 10 typically is nonvolatile, meaning a constant supply of power is not needed to retain a logic value written to the memory cell. The magnetic moment of the storage layer may be configured to remain stable until new data is written to the memory cell, typically by simultaneously passing current of appropriate magnitude and direction through write lines associated with the memory cell. Because memory cell 10 typically is capable of storing a written logic value without a constant source of power, retention of the bit of information stored by the memory cell need not be dependent on a constant delivery of power from a power source, such as an electrical outlet or a battery. Therefore, the logic value may remain unchanged, even if the memory device is unpowered. Nonetheless, the logic value may be selectively changeable. If a logic value is desired to be overwritten, current may be passed through associated write lines, thus effectuating a toggling of the magnetic moment of the storage layer of the memory cell. In this manner, a logic value of 1 may be changed to 0, or a logic value of 0 may be changed to 1.

Figure 2:
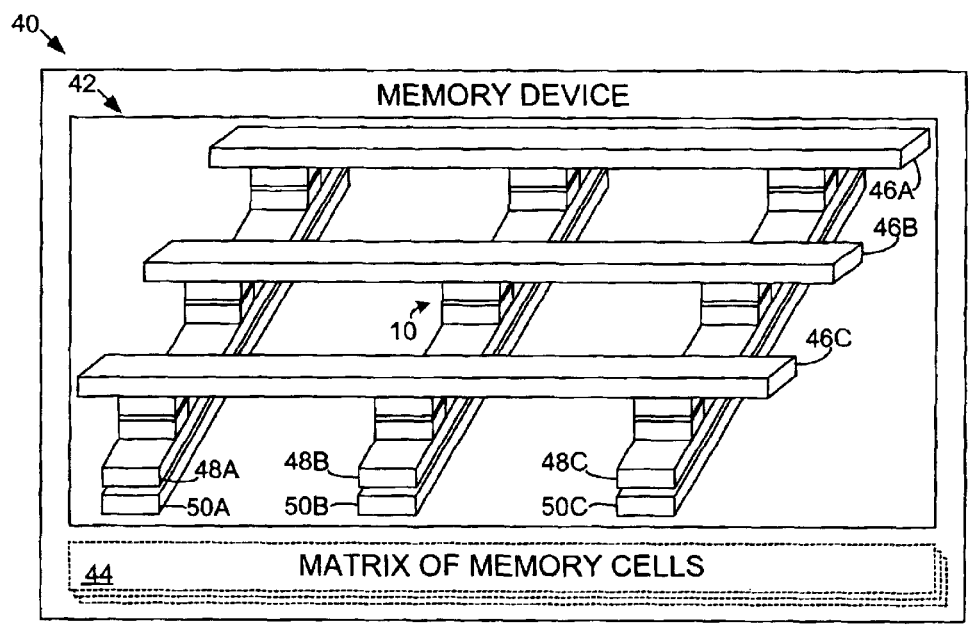
FIG. 2 is a schematic view of a memory device including a matrix of memory cells.
Figure 3:
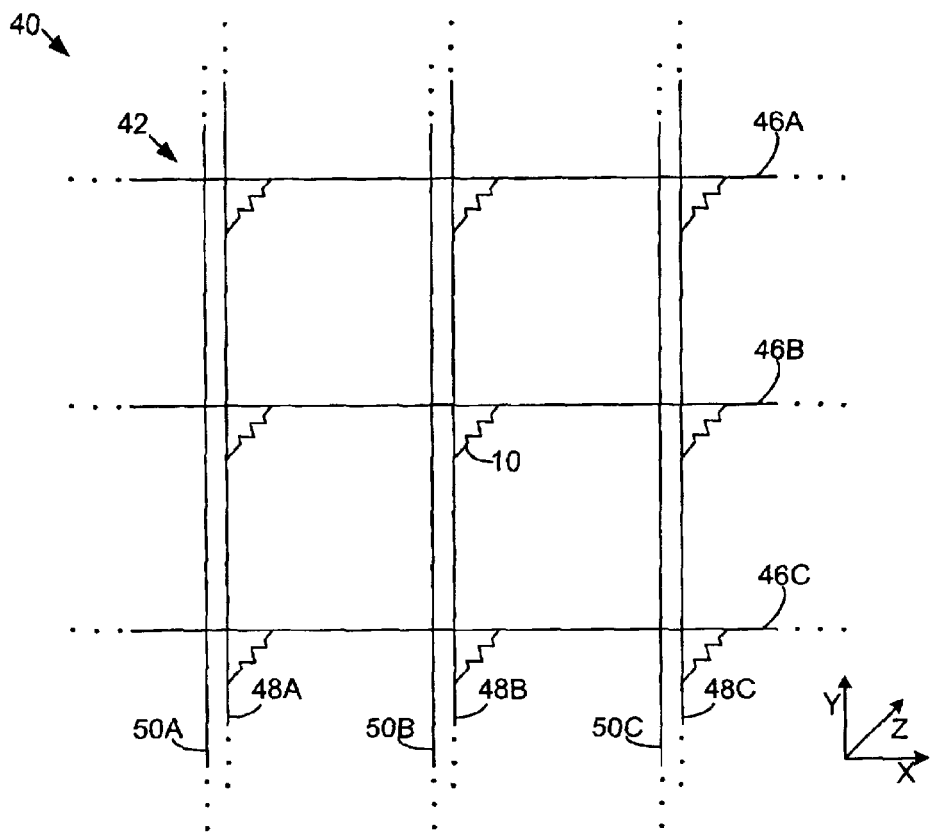
FIG. 3 is a schematic view of a matrix of memory cells.

A single memory cell, as described above, may be configured to store a single bit of information, and a plurality of memory cells may collectively store a corresponding plurality of bits of information. FIGS. 2 and 3 schematically show a memory device 40 configured to store a plurality of bits of information. As is schematically illustrated in FIGS. 2 and 3, memory device 40 may include a matrix 42 of memory cells, which in turn may include one or more memory cells such as memory cell 10. Matrix 42 is shown with only 9 memory cells. However, matrices of memory cells typically include many more memory cells. Although the discussion and illustrations of memory cells used herein generally uses a matrix with 9 memory cells, 3 column conductors, and 3 row conductors, it should be understood that this is a simplified example that should not be construed as limiting in any way. As schematically illustrated in FIG. 2, memory device 40 may include one or more additional matrices of memory cells, such as is shown at 44. Each matrix may include virtually any number of memory cells. Such memory cells may include semiconductor memory cells.

To facilitate addressing memory cells for reading and writing, each included matrix may be configured as a rectangular array. Although not required, the rectangular array may be configured with $2^n$ columns and $2^m$ rows, where n and m are members of the set of nonnegative integers $\{0, 1, 2, 3, 4, \ldots\}$. For example, a matrix may include 1, 2, 4, 8, 16, etc. rows and/or columns. The total number of memory cells in such a matrix generally is the product of the number of included rows and the number of included columns. As described above, each memory cell may store one bit of information. Therefore, the memory capacity (size) of a matrix corresponds to the number of memory cells of the matrix. Similarly, the size of a memory device corresponds to the number of included matrices and the size of each included matrix.

Memory device 40 may be configured to individually address each included memory cell to write a logic value to the memory cell and/or to read a logic value from the memory cell. Accordingly, memory device 40 may be configured as random access memory for virtually any device. As schematically shown in FIGS. 2 and 3, matrix 42 may include a plurality of row conductor read/write lines 46A, 46B, and 46C, column conductor read lines 48A, 48B, and 48C, and column conductor write lines 50A, 50B, and 50C. As shown, each memory cell may be located at a unique cross-point where a row conductor read/write line intersects a column conductor read line running parallel to a column conductor write line. Therefore, each memory cell may be addressed for writing by a different row read/write line and column write line pair. For example, memory cell 10 may be addressed for writing by row conductor read/write line 46B and column conductor write line 50B. It should be understood that although FIGS. 2 and 3 show a three conductor arrangement, four conductor or other arrangements may also be used. Also, it should be understood that each memory cell may be similarly addressed for reading by read line and/or read/write line pairs.

Figure 4:
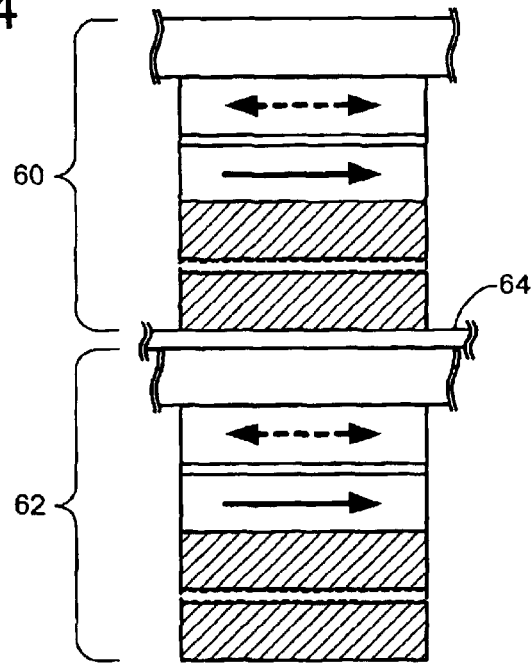
FIG. 4 is a schematic view of two memory cells and associated conductors in a multilayer arrangement.
Figure 5:
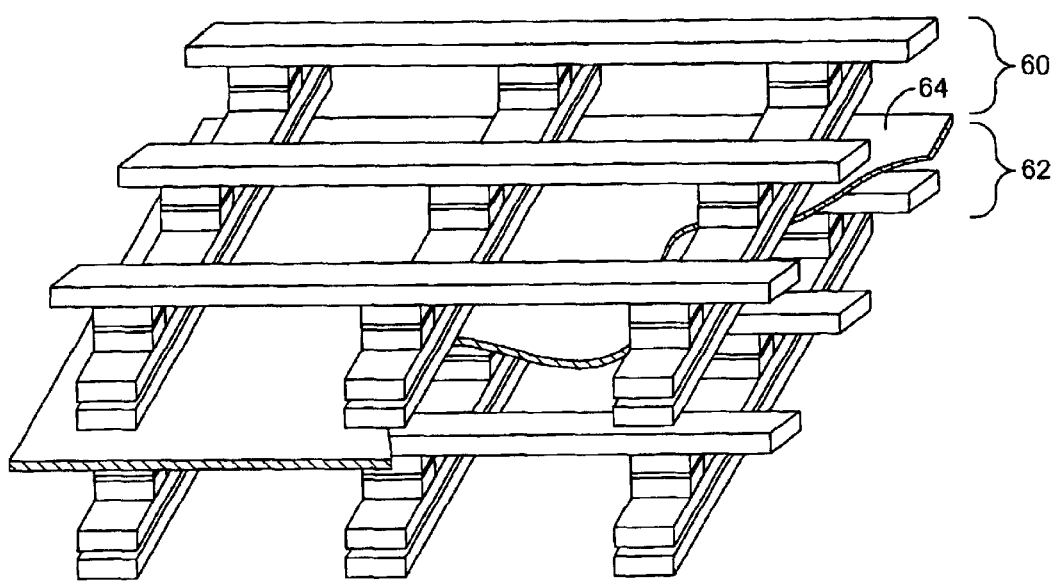
FIG. 5 is a schematic view of a portion of a multilayer memory device.

As is schematically illustrated in FIGS. 4 and 5, matrices of memory cells and corresponding read lines, write lines, and/or read/write lines may be provided in layers, such as layer 60 and layer 62. As shown, each layer may include a matrix of memory cells and corresponding read and write lines. In the illustrated embodiment, each layer is shown as a three conductor layer including column read lines, column write lines, and row read/write lines. However, layers may also be configured with four conductor arrangements. Furthermore, three conductor layers, four conductor layers, and/or other arrangements may be included in the same memory device, and a memory device may include more than 2 layers. An insulating layer 64 may be disposed between adjacent layers.

Turning back to FIG. 3, to effectuate writing, the logic value of memory cell 10 may be changed by simultaneously running current through column write line 50B and row read/write line 46B. Column write line 50B and row read/write line 46B form a pair that is said to correspond to memory cell 10. Similarly, each other memory cell may be said to correspond to a different pair of intersecting write lines. The logic value of each memory cell of matrix 42 may be changed by running current through the corresponding pair of intersecting write lines. To write a desired value, 0 or 1, current is passed through each associated conductor in the proper direction. As described below, a write addressing system may be configured to control current, so that desired logic values may be written to memory. Writing data to an individual memory cell typically includes selectively conducting current through a pair of corresponding write lines while preventing current from flowing through other write lines, thus preventing unwanted writing to occur in other memory cells. For the purpose of illustration below, various arrangements for controlling current through write lines are discussed with reference to column conductor write lines of a three conductor arrangement. However, it should be understood that the below-described arrangements may be equally well suited for row conductor write lines, and/or other write lines, as well as four conductor or other arrangements.

Figure 6:
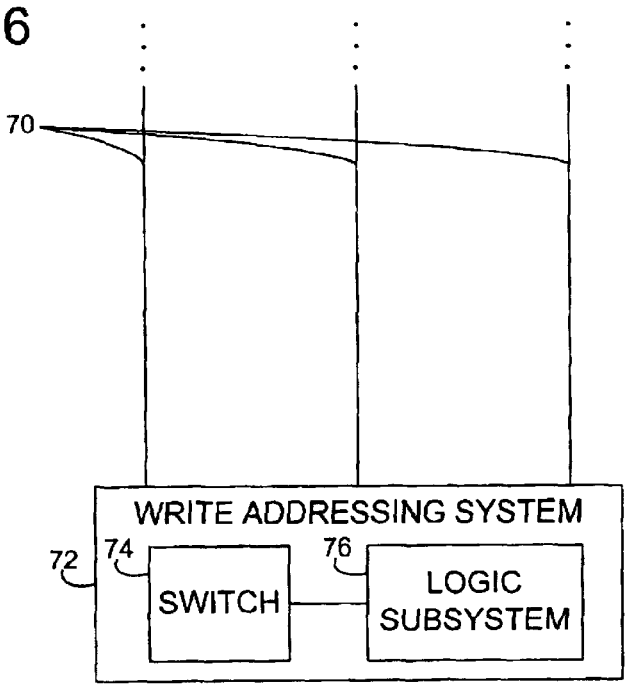
FIG. 6 is a block diagram of column conductor write lines and an associated addressing system used to write data to memory cells.

FIG. 6 shows a plurality of column conductor write lines 70 configured to cooperate with row conductor write lines or row conductor read/write lines (not shown) to write data to memory cells (also not shown), as described above. Three write lines are illustrated for simplicity, although it should be understood that more write lines may be provided, with an increase in the number of write lines generally corresponding to an increase in the number of columns of memory cells. Write lines 70 are operatively coupled to a write addressing system 72, which is configured to selectively control current through the various write lines. Write addressing system 72 may include one or more switches for controlling the current, such as switch 74. In some embodiments, switch 74 may include a write transistor, such as a write transistor formed in a semiconductor substrate, although other switches may be used. The write addressing system may also include a logic subsystem 76 for controlling the included switches, as described below.

Figure 7:
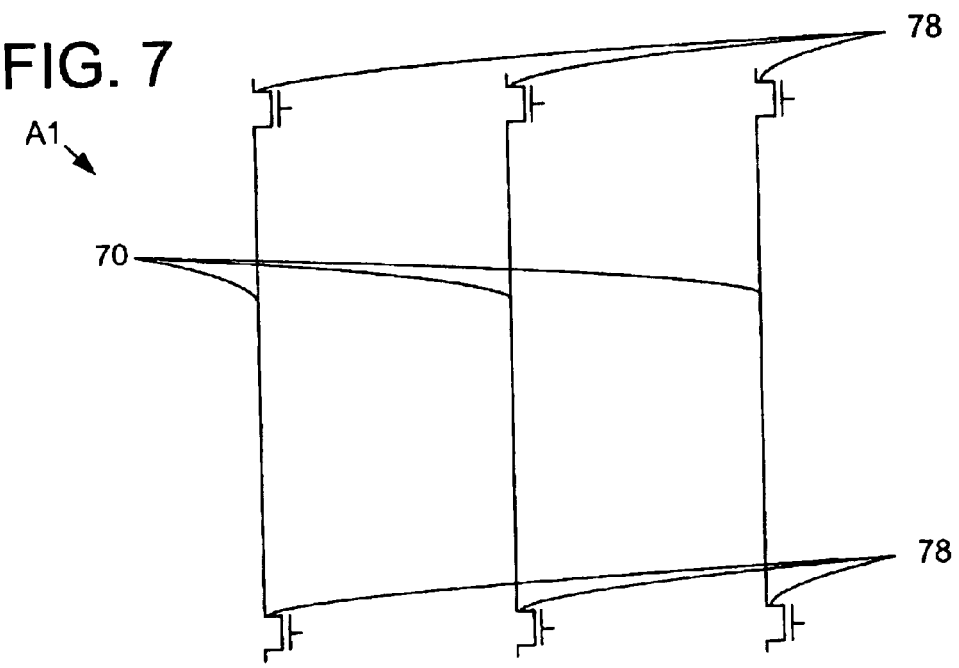
FIG. 7 is a schematic view of column conductor write lines with two associated write transistors per write line.
Figure 8:
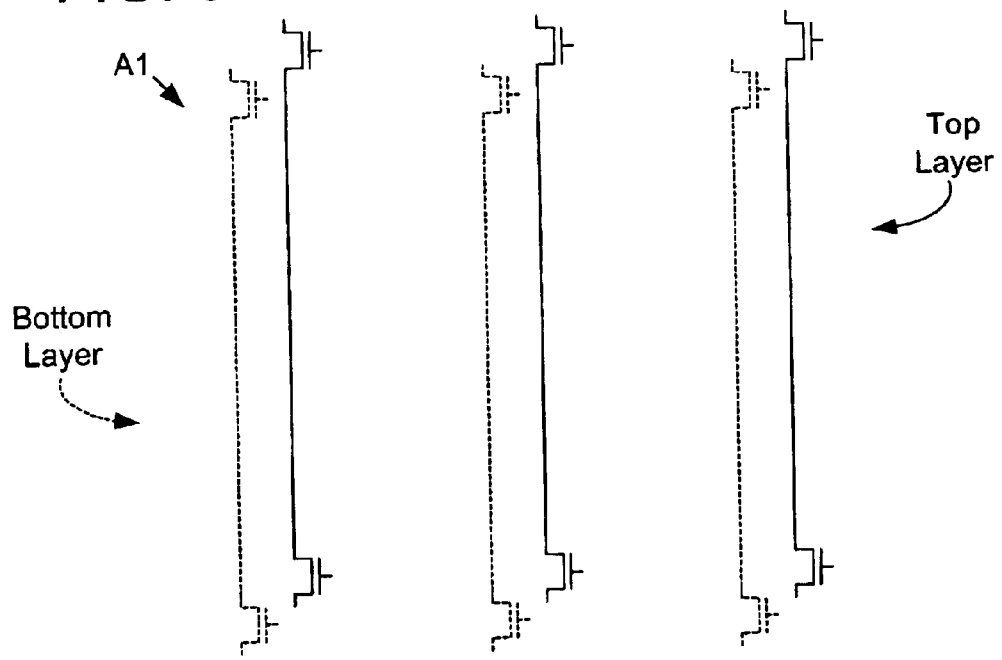
FIG. 8 is a schematic view of a multilayer writing arrangement implementing two write transistors per write line.

FIG. 7 schematically shows an example of one possible arrangement A1 for write addressing a plurality of memory cells. The illustrated arrangement includes column conductor write lines 70 with a write transistor 78 at each end of each write line. The write transistors may selectively control current flow through the write lines. An arrangement, such as that shown in FIG. 7, which uses two write transistors for every write line, may be referred to as a 2n arrangement. Although a 2n arrangement may be used to effectively write data to the memory cells, it should be understood that 2 transistors are used for every column conductor write line. Therefore, for n column conductor write lines, there will be 2n write transistors. This applies for every layer of a memory device, as shown generally in FIG. 8. Assuming that each layer has the same number of columns, a 2n arrangement with m layers will have 2nm write transistors. FIG. 8 schematically shows a multilayer 2n arrangement for write addressing a plurality of memory cells occupying two layers of a memory device (memory cells, column read lines, and row conductors not shown). A top layer is shown in solid lines, while a bottom layer is shown in dashed lines. Each write transistor of a memory device generally occupies area of the semiconductor material used to fabricate the memory device.

Figure 9:
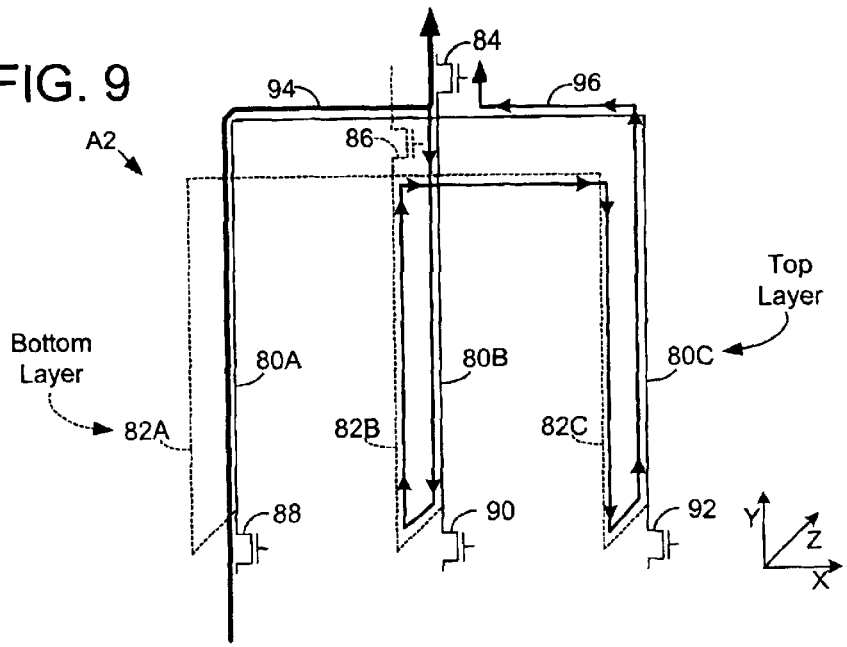
FIG. 9 is a schematic view of a multilayer column conductor write line arrangement implementing fewer than two transistors per write line.

FIG. 9 shows another arrangement A2, which uses fewer transistors, and therefore occupies less area of semiconductor material, thus potentially reducing cost. The illustrated portion of the depicted arrangement includes top and bottom layers, each with three column conductor write lines (80A, 80B, and 80C in the top layer, and 82A, 82B, and 82C in the bottom layer). For each layer, the write lines are electrically connected to the other write lines of the same layer at one end, thus allowing the write lines of each layer to share a transistor that is configured to act as a switch (switch 84 for the top layer, and switch 86 for the bottom layer). This type of sharing may be referred to as horizontal sharing, and switches shared in this manner may be referred to as bridge switches.

At the other end of the write lines, opposite the bridge switches, write lines of one layer are electrically connected to corresponding write lines of the other layers, such as write lines that may be, but are not required to be, located substantially above and/or below each other. For example, in the illustrated embodiment, write lines 80A and 82A are connected, write lines 80B and 82B are connected, and write lines 80C and 82C are connected. Therefore, write lines occupying different layers may share a switch. For example, write lines 80A and 82A share switch 88, write lines 80B and 82B share switch 90, and write lines 80C and 82C share switch 92. This type of sharing may be referred to as vertical sharing, and conductors sharing such switches may be referred to as being in the same vertical plane, although they may not physically be in the same vertical plane. The switches shared between conductors in the same vertical plane may be referred to as ladder switches. Because arrangement A2 of FIG. 9 utilizes horizontal and vertical sharing, it may be referred to as a mixed-sharing arrangement.

A mixed-sharing arrangement that has m layers, with n columns in each layer, generally uses a total of n+m write transistors as switches. As can be easily appreciated, n+m is less than or equal to 2nm for all positive integer values of n and m; and becomes substantially less as either n or m increases. As one example, a memory device with 2 layers, each having 1024 columns, would use 4096 write transistors configured in a 2n multilayer arrangement, and only 1026 write transistors if configured in a mixed-sharing arrangement such as that described above. If the same device had three layers, a 2n arrangement would use 6144 write transistors, while the mixed-sharing arrangement would use only 1027 write transistors. Thus, it can be seen that a mixed-sharing arrangement may lessen the total number of write transistors, decreasing the semiconductor area needed to fabricate the memory device.

A mixed sharing arrangement may be used to control current through the various write lines. For example, to direct current through write line 80A, write transistors 84 and 88 could be switched to allow current flow (activated). Current traveling through write line 80A is schematically represented by bold line 94. Each write conductor may be associated with a unique pair of write transistors, which may be used to direct current through that write line. The following table shows the combinations of transistors used to direct current through each depicted write line:

| Write Line | Transistors |
| --- | --- |
| 80A | 84, 88 |
| 80B | 84, 90 |
| 80C | 84, 92 |
| 82A | 86, 88 |
| 82B | 86, 90 |
| 82C | 86, 92 |

When transistors 84 and 88 are activated, write line 80A is not the only current path available from transistor 84 to transistor 88. As is schematically represented by arrowed line 96, an alternative current path through write lines of both layers exists. In fact, several alternative current paths exist that are not specifically called out in FIG. 9.

Figure 10:
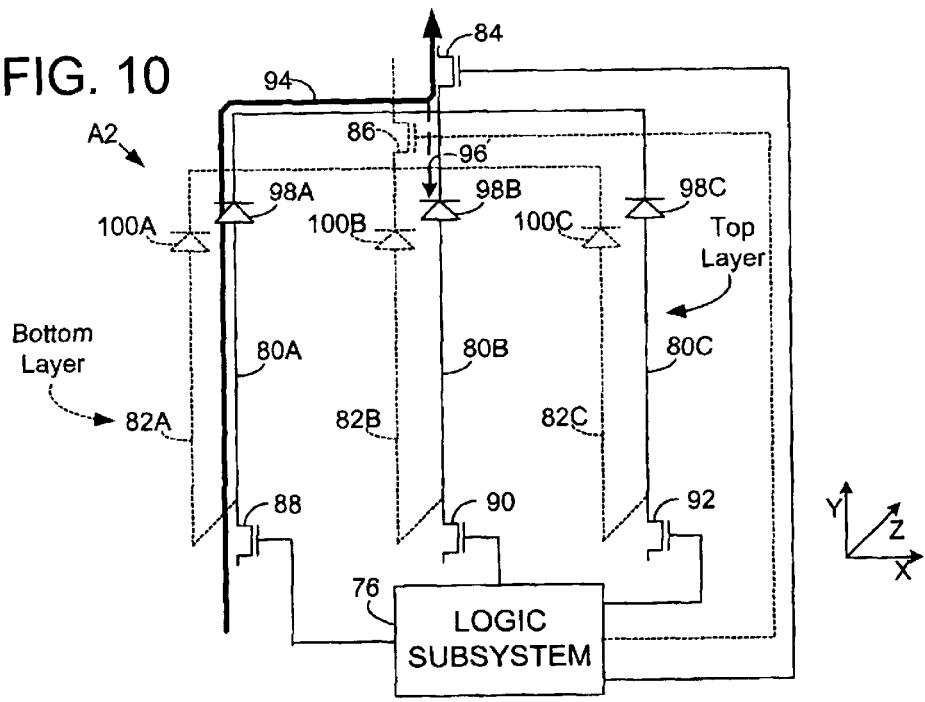
FIG. 10 is a schematic view of the arrangement of FIG. 9, with reverse current limiting devices electrically coupled to each write line.

FIG. 10 shows a mixed-sharing arrangement similar to that shown in FIG. 9, which includes a reverse current limiting device, such as 98A–98C and 100A–100C, interposed between the write transistors associated with each write line. As illustrated in FIG. 10, the reverse current limiting devices may take the form of diodes. However, it should be understood that other devices for controlling the direction of current flow may be used. When present, the reverse current limiting devices block undesired charge paths, which might otherwise reduce the selectivity of a write addressing arrangement. For example, reverse current limiting device 98B blocks charge path 96 of FIG. 9, as shown in dashed lines at 96' of FIG. 10. Collectively, the reverse current limiting devices may block all unwanted charge paths, leaving only a desired path in a desired direction through a selected write line when the write transistors corresponding to that write line are activated. Therefore, a mixed-sharing arrangement incorporating a reverse current limiting device for each write line may exhibit the same selectivity as a 2n arrangement, even though the mixed-sharing arrangement typically uses far fewer transistors.

Figure 11:
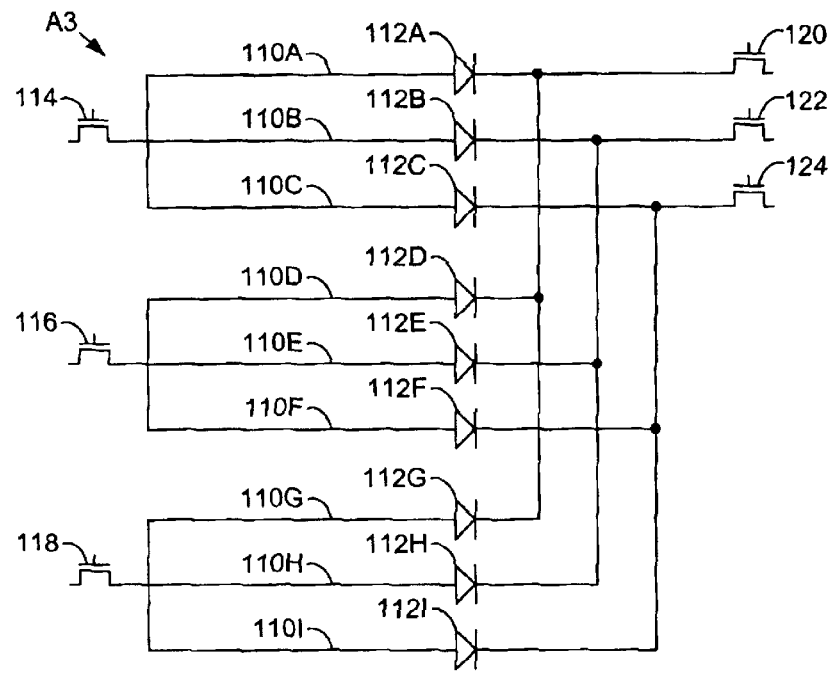
FIG. 11 is a schematic view of a single layer write line arrangement implementing fewer than two transistors per write line with reverse current limiting devices electrically coupled to each write line.

Reverse current limiting devices may be implemented in single layer arrangements configured to reduce the number of write transistors required to provide selectivity to each write line. For example, FIG. 11 schematically illustrates a portion of a single layer write addressing arrangement A3 that uses fewer write transistors than a 2n arrangement. As depicted, arrangement A3 uses $2\sqrt{n}$ write transistors. Arrangement A3 includes a plurality of write lines 110 that are each electrically coupled to a reverse current limiting device 112. As shown, the write lines share transistors 114, 116, 118, 120, 122, 124 so that each write line may be controlled by a unique transistor pair. The following table shows the combinations of transistors used to direct current through each depicted write line:

| Write Line | Transistors |
| --- | --- |
| 110A | 114, 120 |
| 110B | 114, 122 |
| 110C | 114, 124 |
| 110D | 116, 120 |
| 110E | 116, 122 |
| 110F | 116, 124 |
| 110G | 118, 120 |
| 110H | 118, 122 |
| 110I | 118, 124 |

Arrangements A2 and A3 are provided as illustrative examples of write line configurations that may be used to reduce the number of write transistors needed to provide write selectivity to each write line. It should be understood that other arrangements, single layer or multilayer, are possible. Furthermore, arrangements A2 and A3 may be respectively modified to utilize more or less than n+m and $2\sqrt{n}$ write transistors.

Reverse current limiting devices, such as those shown in FIGS. 10 and 11, may include Schottky barrier diodes (metal-semiconductor barrier diodes). For example, a Schottky barrier diode may be fabricated at the junction of a write conductor line and a CMOS semiconductor substrate used to fabricate write transistors. Schottky barrier diodes, and/or other thin film diodes, may be, additionally or alternatively, electrically interposed between adjoining segments of a conductor line. Such configurations limit the amount of semiconductor area needed to form the reverse current limiting device, because smaller and/or fewer devices fabricated in the semiconductor substrate are needed to provide desired write selectivity. Therefore, a mixed-sharing arrangement with reverse current limiting devices may be fabricated with relatively less semiconductor area than a similarly configured multilayer 2n arrangement, and typically much less semiconductor area. Other reverse current limiting devices may be used, such devices typically also limiting the amount of semiconductor area needed to form a particular memory device. For example PIN (P-type, Insulator, N-Type) and PN (P-type, N-type) diodes may be used. In particular, diodes, transistors, and/or other devices that may be implemented as thin film devices may be useful in reducing semiconductor area.

In three conductor arrangements, diodes are generally well suited for use as reverse current limiting devices in a write line that is electrically isolated from the memory cell. When diodes are present, current generally only travels in one direction through the write lines. Therefore, current in the intersecting read/write lines may be selectively directed in a particular direction to effectuate a change from logic value 0 to logic value 1, and in the opposite direction to effectuate a change from logic value 1 to logic value 0.

In four conductor arrangements, diodes may be used in either the column write lines or row write lines that are electrically isolated from the memory cell. The other write lines, intersecting the write lines with the diodes, may use a reverse current limiting device capable of selectively blocking current in either direction. Therefore, current may be selectively directed in either direction, and alternative current paths may be blocked. A thin film transistor may be used in such arrangements.

Figure 12:
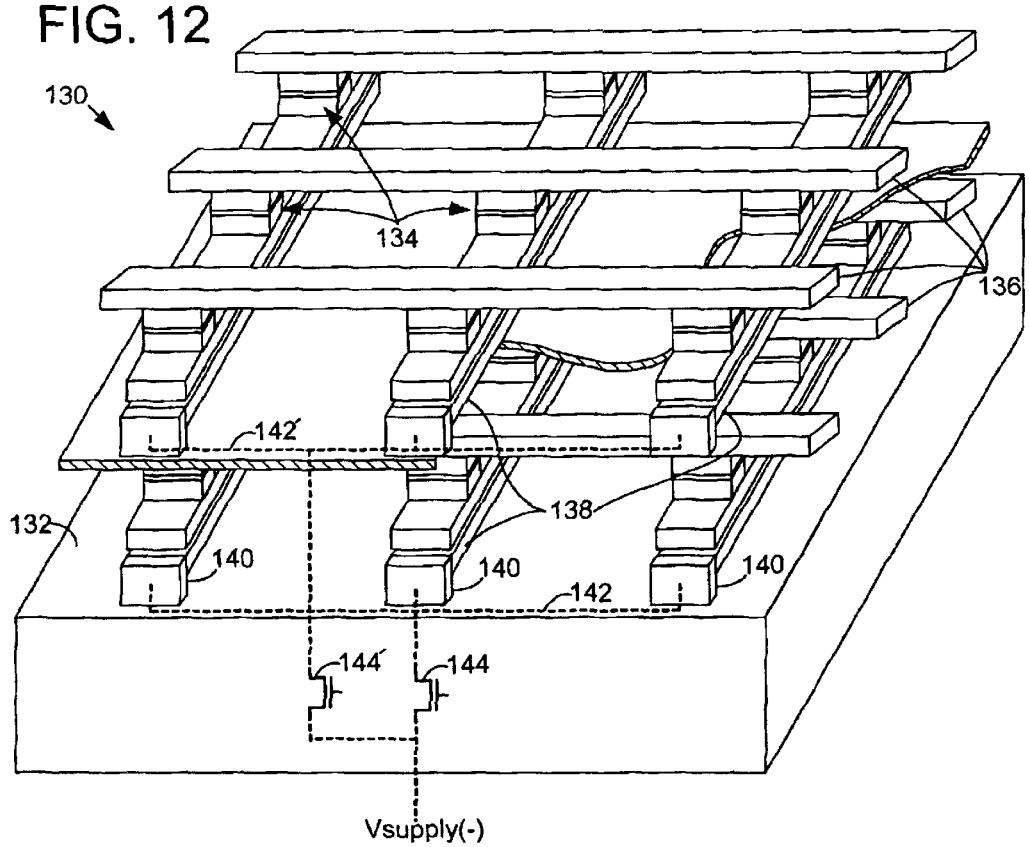
FIG. 12 is a schematic view of a portion of a multilayer memory device including write lines that are electrically coupled to reverse current limiting devices.

FIG. 12 is a schematic view of a portion of a memory device 130, as fabricated on a semiconductor substrate 132.

The illustrated portion of memory device 130 includes two layers, each of which includes a plurality of memory cells 134. Each memory cell is located at the intersection of a row read/write line 136 and a column write line 138, which is electrically isolated from the memory cell. Each write line 138 is electrically coupled to a reverse current limiting device 140. The reverse current limiting devices may take the form of thin film diodes that are disposed between the memory cells and semiconductor substrate 132, and/or the thin film diodes may be electrically interposed between adjoining segments of the conductor for which they are configured to limit reverse current. Such diodes may be Schottky barrier diodes, or other diodes, as described above. Write lines from the same layer may be electrically coupled together, such as via interconnects 142 and 142', and may share a common transistor, such as bridge transistors 144 and 144'.

Figure 13:
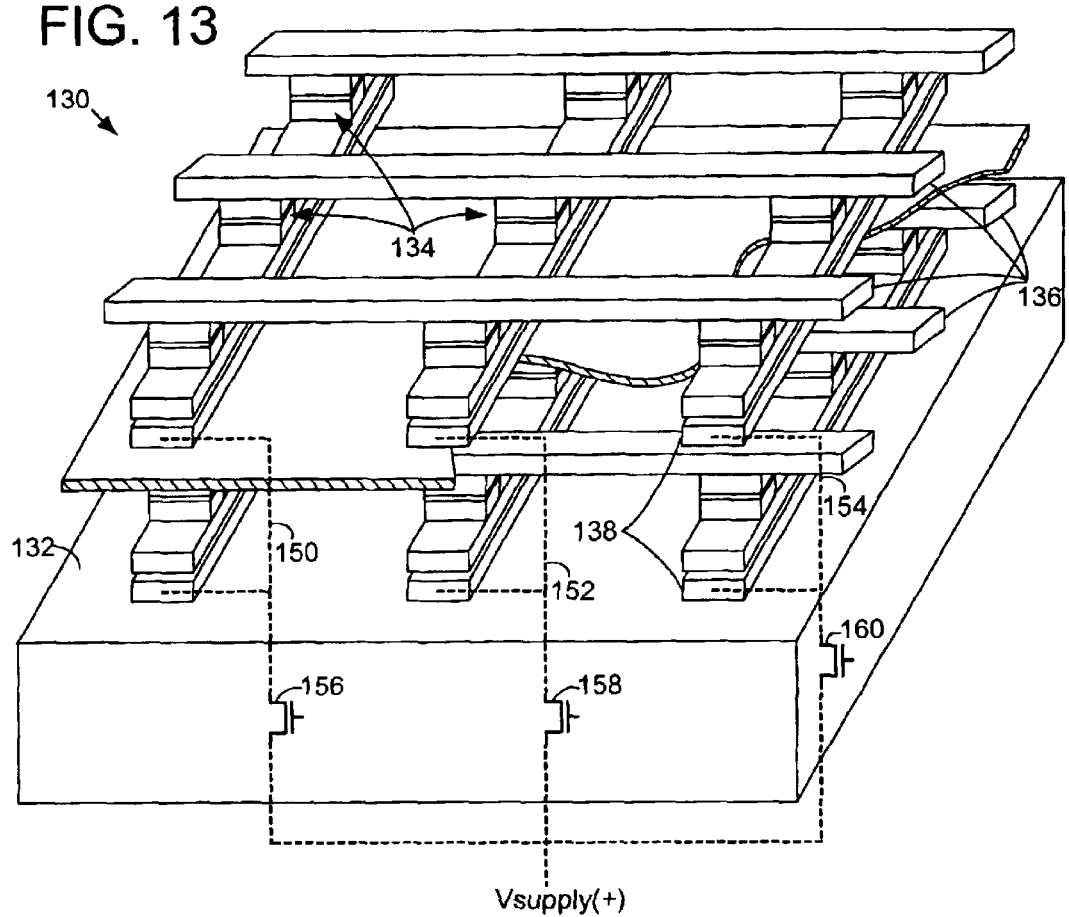
FIG. 13 is a schematic view of a portion of the memory device of FIG. 12 showing write lines electrically coupled between layers and sharing ladder switches.

FIG. 13 is a different view of another portion of a memory device 130, which shows column write lines 138 at the end opposite reverse current limiting devices 140 (not shown). As shown in FIG. 13, write lines from different layers may be electrically coupled together, such as via interconnects 150, 152, and 154, and share a common transistor, such as ladder transistors 156, 158, and 160. As described above, the same write line may be electrically coupled to other write lines of the same layer at one end, and electrically coupled to write lines of other layers at the other end. Thus, each write line may be coupled to a bridge switch at one end and a ladder switch at the other end, with a reverse current limiting device interposed between the switches, such as at the junction of the write line conductor and the semiconductor substrate, or between adjoining segments of the write line.

Switches, such as those used in a write addressing system, may be controlled by a logic subsystem, such as logic subsystem 76 of FIGS. 6 and 10. For example bridge switches and/or ladder switches, as well as other switches, which may include one or more transistors, may be controlled by the logic subsystem. Logic subsystem 76 may be configured to selectively activate various combinations of switches to effectuate a desired current flow through a desired charge path, such as a particular write line, or pair of write lines (read/write lines). Logic subsystem 76 may include various logic transistor arrangements configured to activate the write transistors. Logic subsystem 76 may additionally or alternatively include various diode logic gates configured to activate the write transistors.

Figure 14:
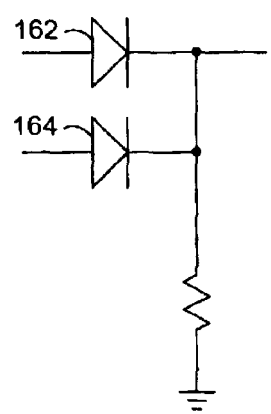
FIG. 14 is a schematic view of a diode logic OR gate that may be used by a diode logic subsystem.
Figure 15:
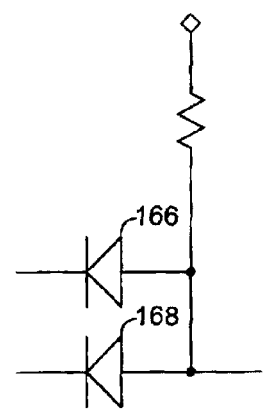
FIG. 15 is a schematic view of a diode logic AND gate that may be used by a diode logic subsystem.

FIG. 14 shows an exemplary diode logic OR gate, which may be used by a diode logic subsystem to control the write transistors. FIG. 15 shows an exemplary diode logic AND gate, which may be used by a diode logic subsystem to control the write transistors. Diodes of the diode logic subsystem, such as diodes 162, 164, 166, and 168 of FIGS. 14 and 15, may be fabricated as thin film diodes, similar to diodes 140 of FIG. 12, adjacent to or away from the main semiconductor substrate, thus minimizing the semiconductor area needed to fabricate a particular device. As explained above with reference to diodes implemented as reverse current limiting devices, reducing the amount of semiconductor area needed to fabricate a device typically reduces the cost of fabricating the device. Diode logic OR gates and/or diode logic AND gates may cooperate with other devices, such as logic transistors, to control write transistors.

While the present description has been provided with reference to the foregoing embodiments, those skilled in the art will understand that many variations may be made. The description should be understood to include all novel and non-obvious combinations of elements described herein, and claims may be presented in this or a later application to any novel and non-obvious combination of these elements. The foregoing embodiments are illustrative, and no single feature or element is essential to all possible combinations that may be claimed in this or a later application. Where the claims recite "a" or "a first" element or the equivalent thereof, such claims should be understood to include incorporation of one or more such elements, neither requiring nor excluding two or more such elements.

What is claimed is:

1. A memory device, comprising:
   a matrix of memory cells; and
   an arrangement of write lines electrically isolated from the memory cells and configured to write data to the memory cells, wherein each write line of the arrangement is electrically coupled to a reverse current limiting device.

2. The memory device of claim 1, wherein the reverse current limiting device includes a diode.

3. The memory device of claim 2, wherein the diode is a Schottky barrier diode.

4. The memory device of claim 2, wherein the diode is a thin film diode.

5. The memory device of claim 1, wherein the matrix of memory cells is one of a plurality of matrices of memory cells, each matrix occupying a different layer of the memory device, and wherein each layer of the memory device includes an arrangement of write lines that are electrically isolated from the memory cells of that layer, each write line of the arrangement being electrically coupled to a reverse current limiting device.

6. The memory device of claim 5, wherein each write line is addressable via a bridge switch and a ladder switch.

7. The memory device of claim 6, wherein the bridge switch includes a write transistor electrically coupled to plural write lines of a layer.

8. The memory device of claim 7, wherein the ladder switch includes a write transistor electrically coupled to a write line of plural layers.

9. The memory device of claim 7, wherein the bridge switch is controlled via a logic subsystem including diode logic gates.

10. The memory device of claim 9, wherein the diode logic gates include thin film diodes.

11. The memory device of claim 6, wherein the ladder switch includes a write transistor electrically coupled to a write line of plural layers.

12. The memory device of claim 11, wherein the ladder switch is controlled via a logic subsystem including diode logic gates.

13. The memory device of claim 12, wherein the diode logic gates include thin film diodes.

14. The memory device of claim 6, wherein the reverse current limiting device electrically coupled to a write line is electrically interposed between the bridge switch and the ladder switch configured to address that write line.

15. The memory device of claim 5, further comprising, for each layer of the memory device, an arrangement of read lines electrically coupled to the memory cells of that layer, and an arrangement of read/write lines electrically coupled to the memory cells of that layer.

16. The memory device of claim 1, wherein the matrix of memory cells include semiconductor memory cells.

17. The memory device of claim 1, wherein the arrangement of write lines includes a plurality of substantially coplanar parallel write lines.

18. A memory device, comprising:

a first matrix of memory cells occupying a first layer of the memory device;

a first arrangement of write lines electrically isolated from the first matrix of memory cells and configured to write data to the first matrix of memory cells, wherein each write line of the first arrangement of write lines is electrically coupled to a thin film diode configured to limit reverse current;

at least a second matrix of memory cells occupying a second layer of the memory device; and a second arrangement of write lines electrically isolated from the second matrix of memory cells and configured to write data to the second matrix of memory cells, wherein each write line of the second arrangement of write lines is electrically coupled to a thin film diode configured to limit reverse current.

19. The memory device of claim 18, wherein the write lines of the first arrangement share a bridge switch with other write lines of the first arrangement, and the write lines of the second arrangement share a bridge switch with other write lines of the second arrangement.

20. The memory device of claim 19, wherein each write line of the first arrangement shares a ladder switch with a write line of the second arrangement.

21. The memory device of claim 20, wherein, for each write line, the thin film diode electrically coupled to that write line is electrically interposed between the bridge switch and the ladder switch shared by that write line.

22. The memory device of claim 18, wherein each write line of the first arrangement shares a ladder switch with a write line of the second arrangement.

23. The memory device of claim 18 further comprising a first arrangement of read lines and a first arrangement of read/write lines.

24. The memory device of claim 23, wherein the read lines and the read/write lines intersect at a plurality of cross-points, and wherein a memory cell is electrically coupled to a read line and a read/write line at each cross-point.

25. A method of fabricating a memory device with reduced semiconductor area; the method comprising:

providing at least a first layer of memory cells;

disposing an arrangement of write lines about each layer of memory cells, wherein each write line is electrically isolated from the memory cells; and electrically incorporating a thin film diode configured to limit reverse current into each write line.

26. The method of claim 25, further comprising providing a write addressing system including ladder and bridge transistors.

27. The method of claim 26, further comprising providing a logic subsystem including diode logic gates, wherein the logic subsystem is configured to selectively activate the ladder and bridge transistors to allow current to pass through selected write lines.

28. A memory device, comprising:

a matrix of data storing means; and an arrangement of data writing means electrically isolated from the data storing means and configured to write data to the data storing means, wherein each data writing means of the arrangement is electrically coupled to a reverse current limiting means.

29. A memory device, comprising:

a matrix of memory cells;

an arrangement of write lines configured to write data to the memory cells; and a write addressing system including a plurality of write transistors, the write transistors collectively configured to provide write selectivity to each write line by conditionally allowing current to pass through selected write lines, wherein the write addressing system includes a logic subsystem that includes a plurality of diode logic gates, wherein the logic subsystem is configured to selectively activate the write transistors to allow current to pass through the selected write lines.

30. The memory device of claim 29, wherein the diode logic gates include thin film diodes.

31. The memory device of claim 29, wherein the arrangement of write lines are electrically isolated from the matrix of memory cells.

* * * * *